US007881826B2

(12) United States Patent
Cakici et al.

(10) Patent No.: US 7,881,826 B2
(45) Date of Patent: Feb. 1, 2011

(54) PREEMPTIVE THERMAL CONTROL BY PROCESSOR THROTTLING IN A MODULAR COMPUTING SYSTEM

(75) Inventors: Sertac Cakici, Austin, TX (US); John Farrugia, Austin, TX (US); Ryan M. McBeth, Round Rock, TX (US); Meghna Paruthi, Austin, TX (US); Madeline Vega, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 12/104,694

(22) Filed: Apr. 17, 2008

(65) Prior Publication Data

US 2009/0265044 A1 Oct. 22, 2009

(51) Int. Cl.
*G05B 13/02* (2006.01)
*G01K 1/08* (2006.01)
*G06F 1/00* (2006.01)
*G06F 15/173* (2006.01)

(52) U.S. Cl. .................. 700/276; 700/46; 702/132; 713/322; 709/226

(58) Field of Classification Search .............. 700/9, 700/20, 28–29, 46, 49, 275–278, 282, 299, 700/300; 702/132, 182–184, 188; 713/300, 713/322; 709/226
See application file for complete search history.

(56) References Cited

U.S. PATENT DOCUMENTS

| 6,134,621 | A | * | 10/2000 | Kelley et al. .................. 710/311 |
| 2004/0217072 | A1 | * | 11/2004 | Bash et al. .................... 211/26 |
| 2004/0268166 | A1 | * | 12/2004 | Farkas et al. ................. 713/320 |
| 2005/0286220 | A1 | * | 12/2005 | Moore et al. ................. 361/687 |
| 2007/0109725 | A1 | | 5/2007 | Lindell et al. |
| 2007/0118771 | A1 | | 5/2007 | Bolan et al. |
| 2007/0143635 | A1 | | 6/2007 | Hughes et al. |
| 2007/0150757 | A1 | | 6/2007 | Aldereguia et al. |
| 2007/0157037 | A1 | | 7/2007 | Campbell et al. |
| 2007/0230121 | A1 | | 10/2007 | Chen |

\* cited by examiner

*Primary Examiner*—Sean P Shechtman
(74) *Attorney, Agent, or Firm*—Dillon & Yudell LLP

(57) ABSTRACT

A modular computing housing includes a housing structure having a plurality of component slots that each can receive one of a plurality of components, where at least one of the components includes a processor having an operating frequency. A cooling system provides airflow through each of the component slots. A thermal control system can be communicably connected to each of the component slots and each of the received component processors. The thermal control system receives configuration data from each of the component slots, retrieves throttle data corresponding to the configuration data, and directs at least one received component processors to reduce its operating frequency in accordance with the throttle data.

17 Claims, 6 Drawing Sheets

PREEMPTIVE THERMAL CONTROL BY PROCESSOR THROTTLING IN A MODULAR COMPUTING SYSTEM

BACKGROUND OF THE INVENTION

1. Technical Field

The present invention relates in general to thermal control for electronic systems and, in particular, to thermal control for electronic systems including modular processor-based components.

2. Description of the Related Art

A modular computing system, such as a rack-mounted server, may include a modular enclosure or housing for a variety of computing components. This modular enclosure typically contains an integrated power supply, cooling system, communication connections and data storage. The modular enclosure allows the use of simplified components that may be smaller and potentially cheaper than standard components.

A modular computing system may include a variety of processor-based computing components, selected by a user and connected via the modular enclosure. The modular enclosure provides a physical structure to support and connect computing components within a compact space. The number of components and their spatial arrangement within the housing may be varied to suit a particular user's specific computing needs. The modular enclosure may be designed to allow a user to plug in, for example, hundreds of computer components at one time. The components can be plugged into a modular housing in a wide variety of user-selected configurations.

As will be appreciated, modular computing system will include numerous electrical components, such as processors or central processing units (CPUs), which draw electrical current to perform their intended functions. Any electrical device through which electrical current flows produces heat. The amount of heat any one device generates generally is a function of the amount of current flowing through the device. Consequently, placing numerous computing components in close proximity within a modular enclosure generally creates thermal issues and necessitates the use of a cooling system within the modular enclosure.

Typically, each integrated circuit manufacturer designs its products to operate correctly within a predetermined temperature range. If the temperature exceeds the predetermined range (i.e., the device becomes too hot), the integrated circuit device may not function correctly, thereby potentially degrading the overall performance of the computer system. Thus, it is desirable for a computer system generally and its components specifically to operate within a thermally benign environment.

Some computers implement two techniques for cooling the computer's internal electrical components. One technique, called "passive" cooling, slows down the operating speed of a component so that the component will produce less heat. For example, the clock frequency of a CPU operating at 2 GHz may be reduced to lower frequency, such as 1.5 GHz. With fewer transistor state changes occurring per second, less current flows through the CPU each second, and thus, less heat is generated by the device.

The second cooling technique, referred to as "active" cooling, uses one or more fans to force air around one or more "hot" components through a vent and outside the computer. Thus, active cooling removes the warm air from a computer. A typical modular enclosure may cool its internal components utilizing fans at the rear of the housing, which pull air through the interstices between components and out the back of the modular enclosure.

Forced air cooling may become less effective when the slots in a modular enclosure are not fully populated. A slot without a component installed offers no resistance to the airflow, causing a greater proportion of the airflow to move through the empty slot and significantly less airflow to move through the interstices between other components. The result is a reduced cooling effect, potentially causing the installed components to overheat. An airflow restrictor may be installed in an empty slot to block airflow; however, in some cases the airflow restrictor may only somewhat restrict airflow, thus reducing but not eliminating the potential for overheating caused by airflow reduction. Flaps may also be attached to the openings to hang over the space and can be used in some cases to provide a filler-like restriction of the airflow through unused and empty slots.

Overheating conditions are typically monitored using temperature sensors. A cooling system may be programmed to respond to an overheating condition by changing fan speeds, changing a clock frequency for one or more components, or otherwise altering the thermal environment. These reactive responses to an overheat condition may result in damage to the hardware despite the response because the damage caused by overheating may be immediate.

SUMMARY OF THE INVENTION

A modular computing housing includes a housing structure having a plurality of component slots that each can receive one of a plurality of components, where at least one of the components includes a processor having an operating frequency. A cooling system provides airflow through each of the component slots. A thermal control system can be communicably connected to each of the component slots and each of the received component processors. The thermal control system receives configuration data from each of the component slots, retrieves throttle data corresponding to the configuration data, and directs at least one received component processors to reduce its operating frequency in accordance with the throttle data.

A thermal control process in a computing component housing including a plurality of component bays determines the configuration status of component bays in the housing and determines throttle parameters based on said configuration status. The operating frequency of a processor may be changed based on said throttle parameters.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
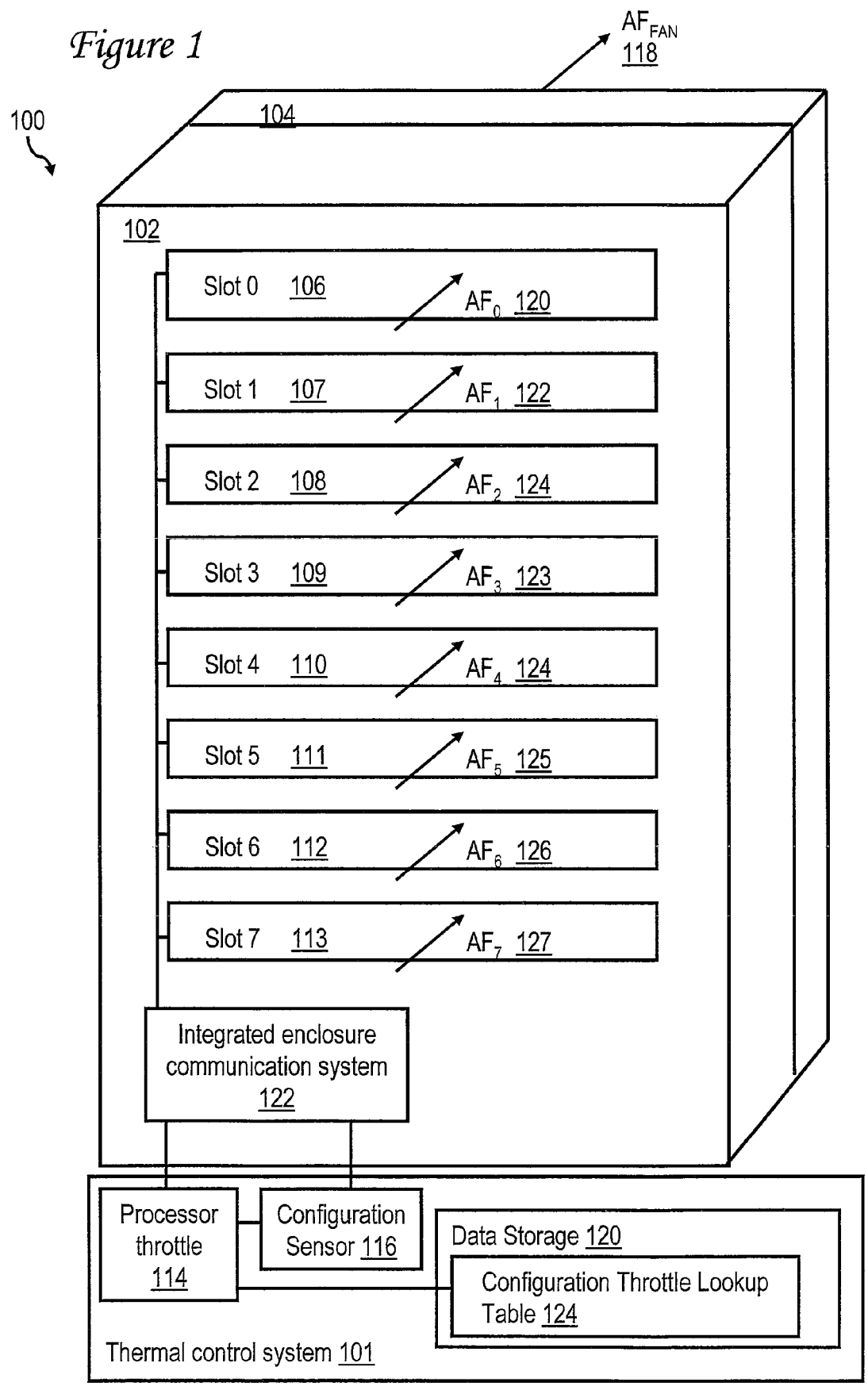
FIG. 1 is a block diagram depicting a modular computing housing with a thermal control system in accordance with an embodiment.

With reference to FIG. 1, a block diagram depicts a modular computing system 100 in accordance with an embodiment. The modular computing system 100 includes a modular component housing 102 having slots 106, 107, 108, 109, 110, 111, 112 and 113 to receive electronic components (not shown), such as circuit cards or circuit boards. A particular modular component housing 102 may include any number of slots in any number of configurations. The eight slots shown, slot 0 106, slot 1 107, slot 2 108, slot 3 109, slot 4 110, slot 5 111 slot 6 112 and slot 7 112, could be arranged vertically and/or horizontally, or in any other suitable arrangement.

The modular component housing 102 is physically proximate, integrated or includes a cooling system 104, generating an airflow out of the modular component housing $AF_{fan}$ 118 (which may be expressed, for example, in standard cubic feet per second), which is generally equal to the sum of the inflows 120, 121, 122, 123, 124, 125, 126, and 127 into slots 106, 107, 108, 109, 110, 111, 112 and 113.

In normal use, each of the slots 106, 107, 108, 109, 110, 111, 112 and 113 may receive an electronic component (not shown), may receive an airflow restriction filler (not shown), or may be empty. If present, an electronic component (not shown) may be, for example, a data processing system or other processor-based device to be cooled by airflow through the modular component housing. An airflow restriction filler may be any structure that blocks or generally restricts airflow through a slot.

A thermal control system 101 may be provided in association with or integrated into modular computer enclosure 102. In the depicted embodiment, thermal control system 101 includes a configuration sensor 116 communicably coupled to each of slots, to detect or otherwise determine the status of each of slots 106, 107, 108, 109, 110, 111, 112 and 113. The status may include component identification, airflow restriction filler identification, empty slot identification, durations of the presence or absence of a component (not shown) and any data relevant to the configuration status. Although the configuration sensor 116 is depicted independently, the function of a smart-detection of the slot status may also or alternatively be implemented in an integrated enclosure communication system 122. Configuration sensor 116 may be communicably coupled to a processor throttle module 114 within thermal control system 101 to communicate data, including the status of each of slots 106, 107, 108, 109, 110, 111, 112 and 113.

Processor throttle module 114 is communicably coupled to data storage 120 including configuration throttle lookup data 124. In at least some embodiments, processor throttle module 114 may be implemented as a program product including a computer-readable storage medium storing appropriate program code. In other embodiments, processor throttle module 114 may be implemented in any combination of hardware, software and/or firmware. Configuration throttle lookup data 114 may include airflow models of the configuration. The processor throttle module 114 receives the status data from the configuration sensor 116 and consults the configuration throttle lookup data on the data storage 120 to determine throttle data utilized to control heat dissipation of components installed in slots 106, 107, 108, 109, 110, 111, 112 and 113.

The processor throttle module 114 is communicably coupled to the components installed in each of slots 106, 107, 108, 109, 110, 111, 112 and 113. Processor throttle module 114 provides throttle data to the components installed in each of the slots 106, 107, 108, 109, 110, 111, 112 and 113, where the throttle data is appropriate to the component to control the component's processor speed. The throttle data may include timing and duration data to direct the timing of speed change initiation and the time the speed change will remain in effect, as well as any other data relevant to heat control of the component.

Figure 2:
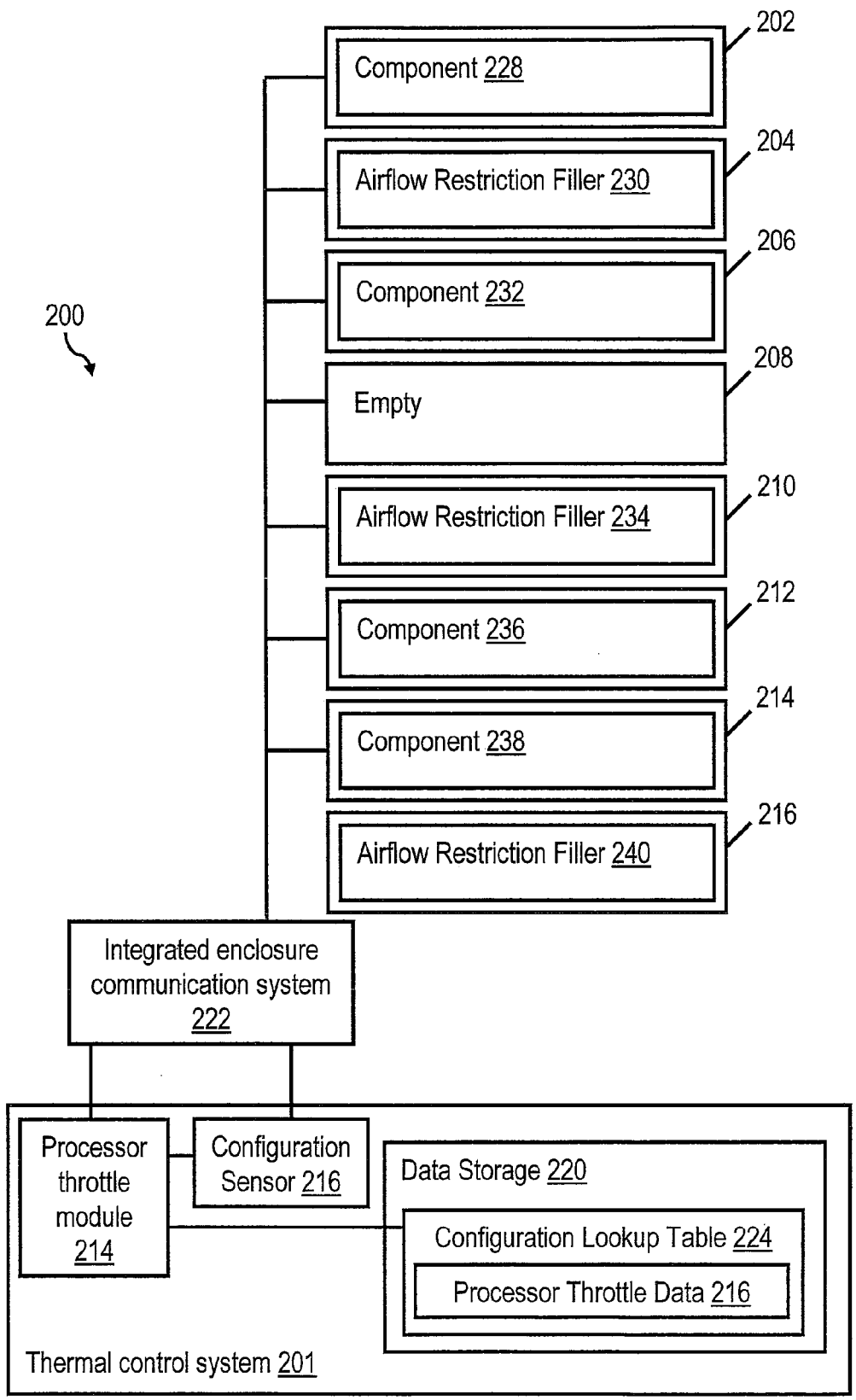
FIG. 2 is a block diagram depicting a thermal control system in accordance with an embodiment.

With reference to FIG. 2, a block diagram depicts an exemplary configuration of a modular computing system 200 in accordance with one embodiment. In the depicted embodiment, modular computing system 200 includes first through eighth slots 202-216. A component 228 is installed in first slot 202, an airflow restriction filler 230 is installed in second slot 204, and a component 232 is installed in a third slot 206. Fourth slot 208 may be empty. Airflow restriction fillers 234 and 240 are also installed in fifth slot 210 and eighth slot 216, respectively, and components 236 and 238 are installed in sixth slot 212 and seventh slot 214, respectively. Each of the components 228, 232, 236 and 238 may include a processor (not shown) that can be throttled to operate a less than the processor's maximum operating frequency.

As described above with reference to FIG. 1, modular computing system 200 includes a thermal control system 201, which may be coupled to an integrated enclosure communication system 222. A configuration sensor module 219 may be communicably coupled through integrated enclosure communication system 222 to each of the slots 202, 204, 206, 208, 210, 212, 214 and 216. Configuration sensor module 219 may receive configuration status data from the slots 202, 204, 206, 208, 210, 212, 214, 216 at scheduled intervals, upon request, upon a configuration change, or in any other suitable arrangement. The processor throttle module 218 uses the configuration status data to match processor throttle data 226 in a configuration look-up table 224. The processor throttle data 226 (expressed, for example, as percentage of a processor's standard operating frequency) is communicated to the components 228, 232, 236 and 238 accordingly. By slowing the clock frequency of one or more processors within components 228, 232, 236 and 238, the likelihood of overheating because of unbalanced airflow due to the current configuration of airflow restriction fillers and empty slots is reduced.

Figure 3:
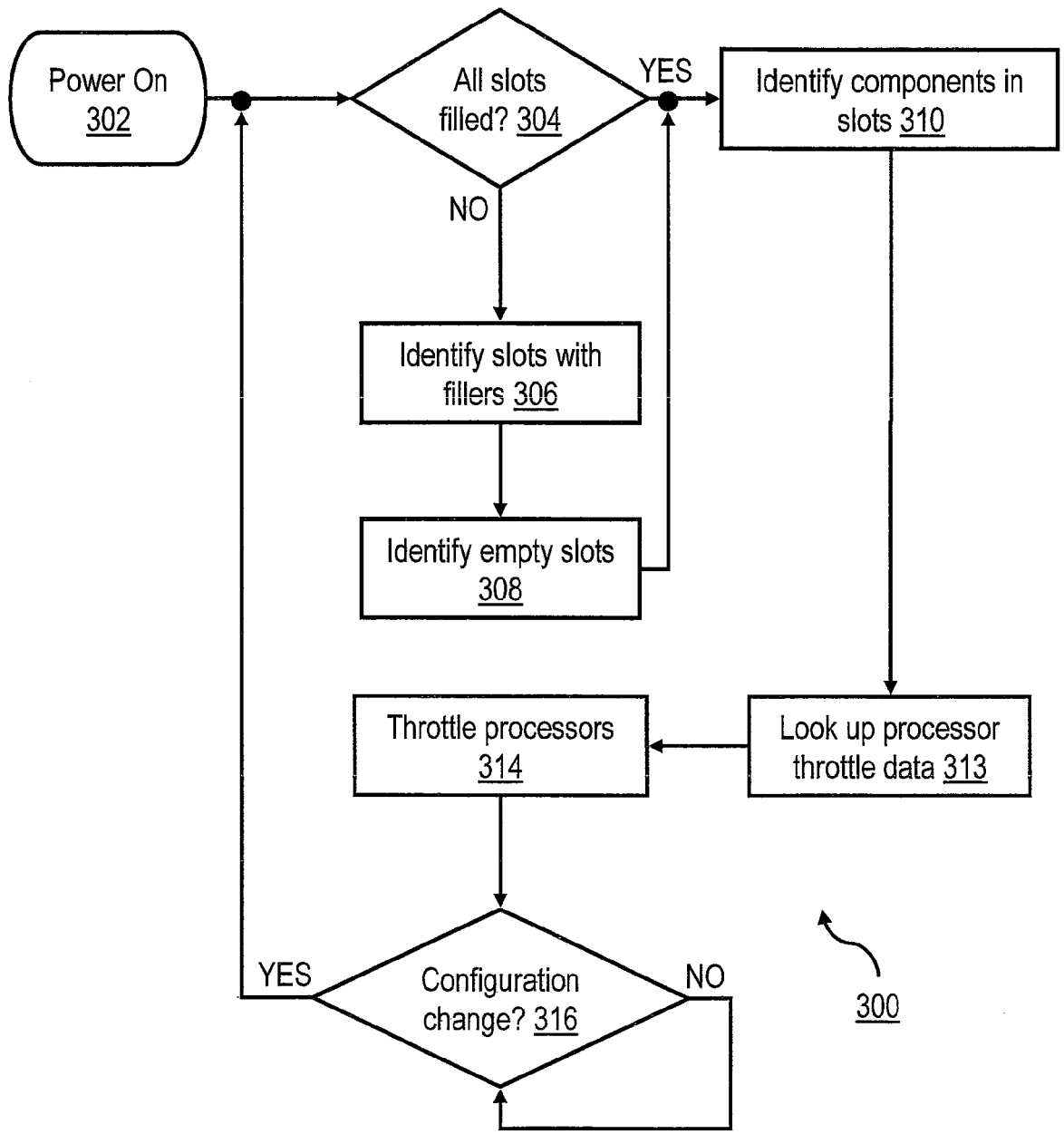
FIG. 3 is a flowchart depicting a process of thermal control in accordance with an embodiment.

With reference to FIG. 3, a flowchart depicts a thermal control process 300 in accordance with an embodiment. The thermal control process 300 begins when the power is turned ON at block 302. Configuration sensor 219 determines at block 304 if components are installed in all of slots 202, 204, 206, 208, 210, 212, 214 and 216. If components are not installed in all of slots 202, 204, 206, 208, 210, 212, 214 and 216, the process follows the NO path to block 306, which depicts configuration sensor 219 determining which, if any, of slots 202, 204, 206, 208, 210, 212, 214 and 216 have airflow restriction fillers installed therein. Configuration sensor 219 also identifies the slots 202, 204, 206, 208, 210, 212, 214 and 216 that are empty are at block 308. Following block 308 or if all the slots were determined to be filled at decision block 304, the process continues to block 310, which depicts configuration sensor 219 identifying the components in slots 202, 204, 206, 208, 210, 212, 214 and 216. The specific characteristics of the components may be used to determine the corresponding processor throttle data 226 stored within configuration look-up table 224 at block 312. Using processor throttle data 226, one or more commands are communicated to the processors of the components to reduce the operating frequency of one or more processors at function block 314.

The process may continue to monitor the configuration at decision block 316. If the configuration is unchanged, the process follows the NO path to continue monitoring. When the configuration has changed, the process follows the YES path to determine the status of the slots 202, 204, 206, 208, 210, 212, 214 and 216 at decision block 304, as has been described.

Figure 4:
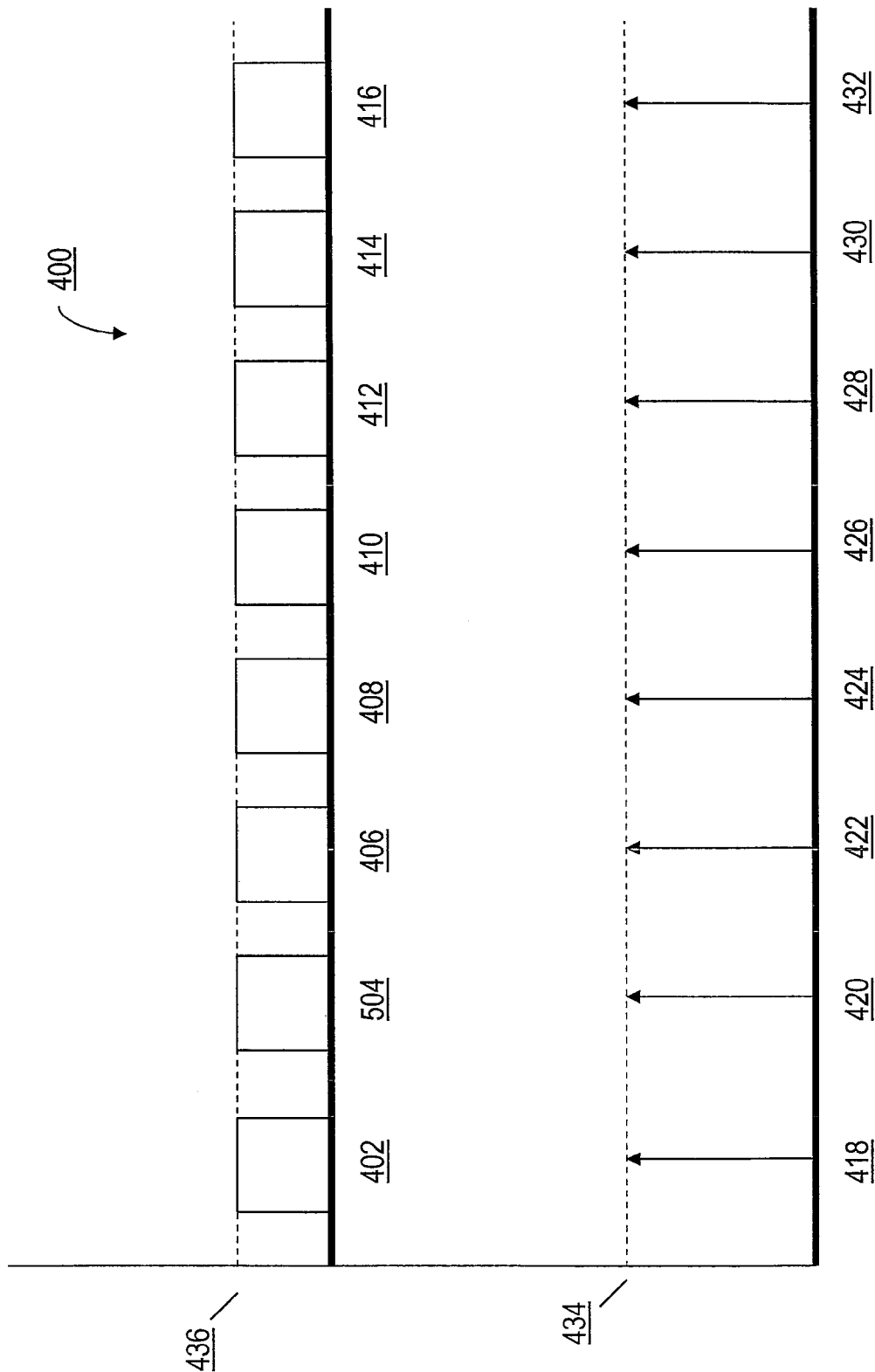
FIG. 4 is a graph depicting thermal energies and airflow for a full slot configuration, in accordance with an embodiment.
Figure 5:
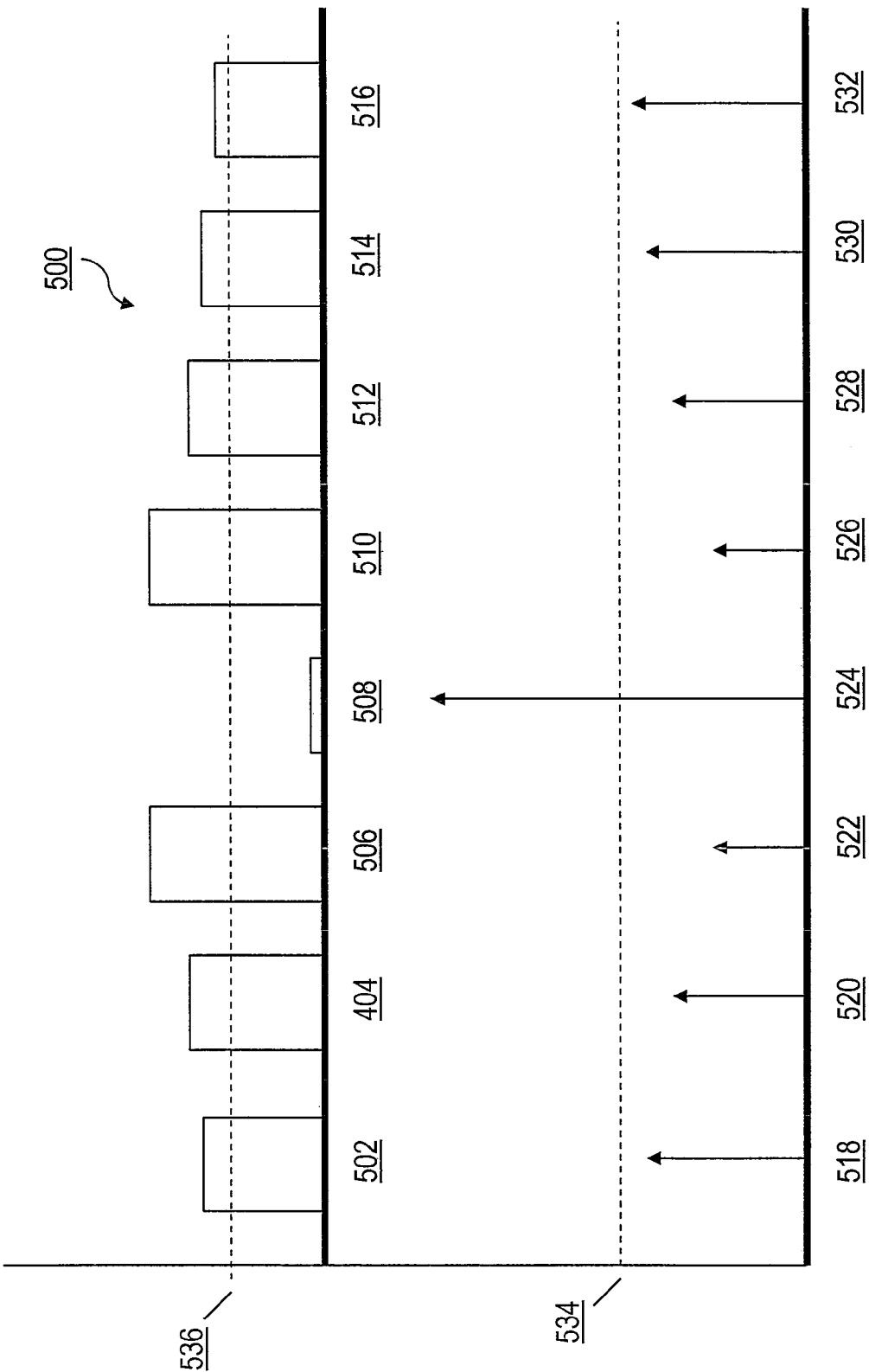
FIG. 5 is a graph depicting thermal energies and airflow for a configuration having an empty slot, in accordance with the prior art.
Figure 6:
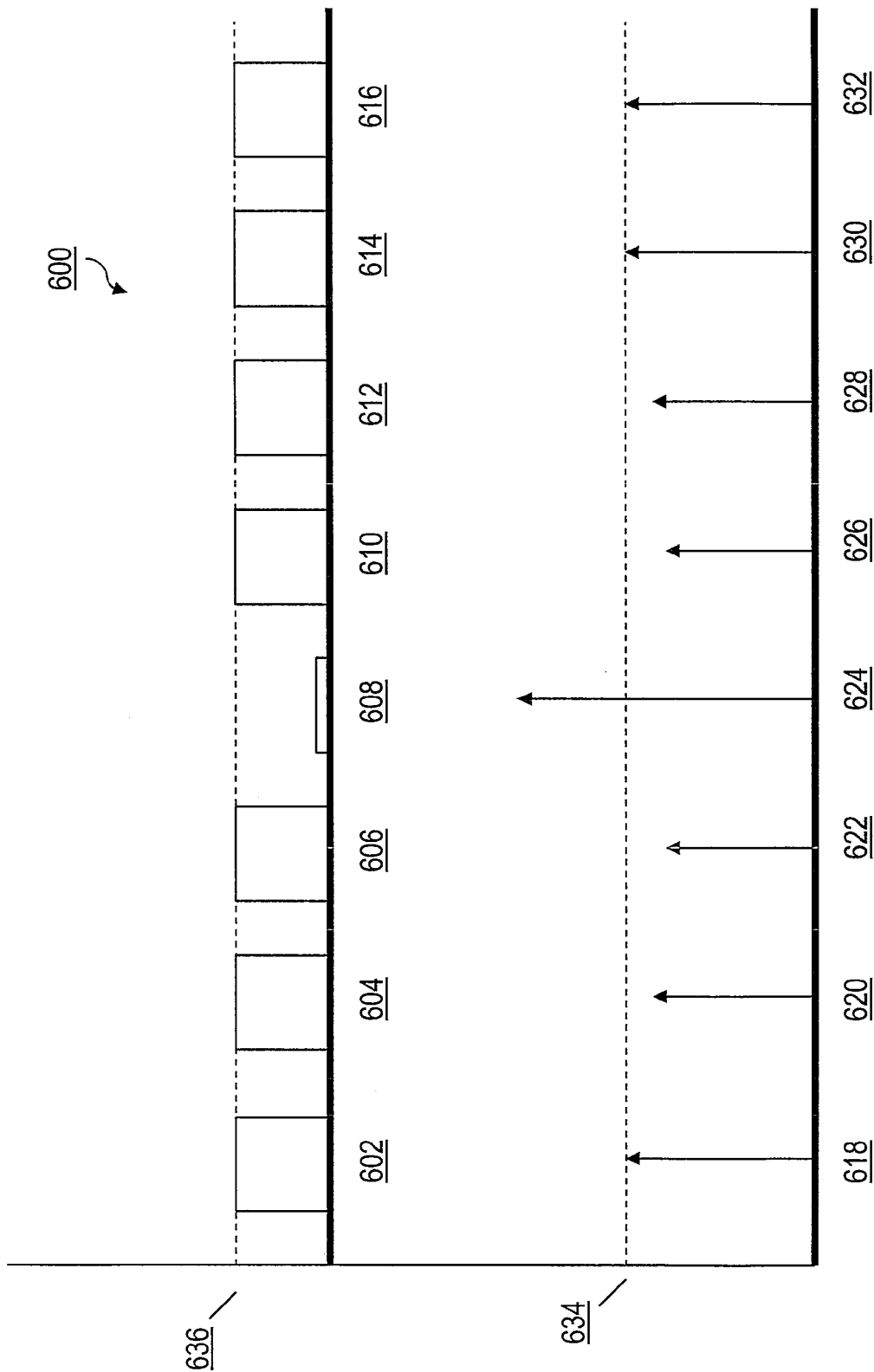
FIG. 6 is a graph depicting thermal energies and airflow for a configuration having an empty slot, in accordance with an embodiment.

With reference to FIGS. 4-6, graphs 400, 500, and 600 depict the thermal energy and airflow regarding eight slots 202, 204, 206, 208, 210, 212, 214 and 216 of modular computer system 200. The first graph 400 depicts the thermal energy and airflow of the eight slots 202-216 with eight installed components. The thermal energies 402, 404, 406, 408, 410, 412, 414 and 416 of each of the eight components are equal and below the maximum optimal temperature 436 for each component. Similarly, the airflow 418, 420, 422, 424, 426, 428, 430, and 432 across each component is equal and at an optimal level 434 for each component.

The second graph 500 given in FIG. 5 depicts the thermal energy and airflow for slots 202-216 with components in the first three slots 202, 204 and 206, an empty slot 208, and then four slots 210, 212, 214 and 216 having components installed therein. The thermal energy of the empty slot is zero (because no component is present), while the airflow 524 through the empty slot 208 is substantially higher than the optimal airflow level 534. As a consequence, the airflows 522, 526 about the components adjacent to empty slot 208 are significantly reduced relative to the optimal airflow 534, and the thermal energies 506, 510 of the components in the slots 206, 210 adjacent to empty slot 208 are substantially higher than the optimal thermal energy 536 for the components. Airflows 518, 528, 530 and 532 of slots less proximate to the empty slot 208 are less disturbed, and the thermal energies 502, 512, 514 and 516 approach optimal level 536.

The third graph 600 given in FIG. 6 depicts the thermal energy and airflow of eight slots 202, 204, 206, 208, 210, 212, 214 and 216 with the same configuration as second graph 500, with components in the first three slots 202-206, an empty slot 208, and then four slots 210-216 having components installed therein, with processor throttling applied in accordance with an embodiment. By slowing the operating frequencies of the processors in proportion to their proximity to empty slot 208, thermal energies 602, 604, 606, 610, 612, 614 and 616 are at their optimal level 636, while the airflows 618, 620, 622, 624, 626, 628, 630 and 632 remain as depicted in graph 500.

As a final matter, it is important that while an illustrative embodiment of the present invention has been, and will continue to be, described in the context of a fully functional computer system with installed software, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include storage media such as floppy disks, hard disk drives, CD ROMs.

While the invention has been particularly shown and described with reference to a preferred embodiment, it will be understood by those skilled in the art that various changes in form and detail may be made therein without departing from the spirit and scope of the invention.

What is claimed is:

1. A modular computer housing system comprising:
    a housing having a plurality of component slots, wherein each of said plurality of component slots can receive one of a plurality of components, wherein said components include at least one processor having an adjustable operating frequency; and
    a thermal control system communicably coupled to each of said component slots and each of said received component processors;
    wherein said thermal control system receives configuration data from each of said plurality of component slots including an identification of a particular component slot among the plurality of component slots that is not occupied by a powered component, retrieves throttle data corresponding to said configuration data, and directs the at least one processor to vary its operating frequency in accordance with said throttle data, wherein the throttle data indicates differing operating frequencies for the at least one processor based upon its physical proximity to the particular component slot.

2. The modular computer housing system of claim 1, and further comprising a cooling system to provide airflow through said plurality of component slots.

3. The modular computer housing system of claim 1, wherein the particular component slot receives an unpowered airflow restriction filler and said configuration data includes airflow restriction filler identification data.

4. The modular computer housing system of claim 1, wherein said thermal control system retrieves said throttle data from a look-up table.

5. The modular computer housing system of claim 1, wherein the particular component slot is empty and said configuration data includes empty component slot identification data.

6. A thermal control process in a modular computing housing including a plurality of component slots, said process comprising:
    determining configuration data regarding the plurality of component slots in the modular computing housing, the configuration data including an identification of a particular component slot among the plurality of component slots that is not occupied by a powered component and at least one component slot including a processor;
    determining processor throttle data based on said configuration data; and
    changing an operating frequency of at least one processor in the plurality of component slots in accordance with said processor throttle data, wherein the throttle data indicates differing operating frequencies for the at least one processor based upon its physical proximity to the particular component slot.

7. The thermal control process of claim 6, wherein said determining configuration data includes identifying component slots having powered components installed therein, component slots having unpowered airflow restriction fillers installed therein, and empty slots.

8. The thermal control process of claim 6, and further comprising forcing air about components installed in said plurality of component slots.

9. The thermal control process of claim 6, wherein determining processor throttle data comprises retrieving said processor throttle data from a look-up table.

10. A program product, comprising:

a computer readable storage medium; and program code stored within the computer readable storage medium that, when executed, cause a computer to perform:

determining configuration data regarding the plurality of component slots in the modular computing housing, the configuration data including an identification of a particular component slot among the plurality of component slots that is not occupied by a powered component and at least one component slot including a processor;

determining processor throttle data based on said configuration data; and changing an operating frequency of at least one processor in the plurality of component slots in accordance with said processor throttle data, wherein the throttle data indicates differing operating frequencies for the at least one processor based upon its physical proximity to the particular component slot.

11. The program product of claim 10, wherein said configuration data is generated by identifying component slots having powered components installed therein, component slots having unpowered airflow restriction fillers installed therein, and empty slots.

12. The program product of claim 10, wherein determining processor throttle data comprises retrieving said processor throttle data from a look-up table.

13. A thermal control system for a modular computing system, comprising:

a configuration sensor to collect configuration data of said modular computing system, the configuration data including an identification of a particular component slot among a plurality of component slots that is not occupied by a powered component;

data storage including a configuration data structure, wherein the data storage outputs processor throttle data from the configuration data structure corresponding to configuration data detected by the configuration sensor; and a processor throttle module that, responsive to the processor throttle data, controls operating frequencies of at least one processor in said modular computing system in accordance with said processor throttle data, wherein the throttle data indicates differing operating frequencies for the at least one processor based upon its physical proximity to the particular component slot.

14. The thermal control system of claim 13, wherein said modular computing system includes an enclosure housing said at least one processor.

15. The thermal control system of claim 13, wherein said configuration data indicates which components are present in the plurality of component slots and a location of each of the components in the modular computing system.

16. The thermal control system of claim 13, wherein said configuration data structure comprises a configuration look-up table.

17. The thermal control system of claim 13, wherein said configuration data indicates that the particular component slot is empty.

* * * * *

UNITED STATES PATENT AND TRADEMARK OFFICE
CERTIFICATE OF CORRECTION

| | | |
|---|---|---|
| PATENT NO. | : 7,881,826 B2 | Page 1 of 1 |
| APPLICATION NO. | : 12/104694 | |
| DATED | : February 1, 2011 | |
| INVENTOR(S) | : Sertac Cakici et al. | |

It is certified that error appears in the above-identified patent and that said Letters Patent is hereby corrected as shown below:

Title Page
In (75), please replace "McBeth; Ryan M." with -- McBeth; Ryan B. --

Signed and Sealed this
Thirty-first Day of May, 2011

David J. Kappos
*Director of the United States Patent and Trademark Office*